United States Patent [19]

Sutardja et al.

[11] Patent Number: 5,686,867
[45] Date of Patent: Nov. 11, 1997

[54] REGULATED SUPPLY FOR VOLTAGE CONTROLLED OSCILLATOR

[75] Inventors: Pantas Sutardja, San Jose; Sehat Sutardja, Cupertino, both of Calif.

[73] Assignee: Marvell Semiconductor, Inc., Sunnyvale, Calif.

[21] Appl. No.: 657,087

[22] Filed: Jun. 3, 1996

Related U.S. Application Data

[62] Division of Ser. No. 493,799, Jun. 22, 1995, Pat. No. 5,576,647.

[51] Int. Cl.$^6$ ............................................. H03L 5/00
[52] U.S. Cl. ...................... 331/57; 331/177 R; 331/186
[58] Field of Search ............................ 331/57, 177 R, 331/185, 186

[56] References Cited

U.S. PATENT DOCUMENTS 5,180,995 1/1993 Hayashi et al. .................... 331/176

*Primary Examiner*—Siegfried H. Grimm
*Attorney, Agent, or Firm*—Fenwick & West LLP

[57] ABSTRACT

A monolithic CMOS phase-lock loop (PLL) circuit provides a high frequency of operation suitable for RF applications. The PLL produces an output clock with high spectral purity and very low jitter. The output clock has a low static phase error relative to a reference input, making the PLL useful for clock synchronizing applications, such as clock recovery elements in transmission/recording channels. The PLL provides in-phase and quadrature signals from a voltage controlled oscillator (VCO) which has two differential transconductors. The second differential transconductor has a positive input coupled to a positive output of the first differential transconductor, a negative input coupled to a negative output of the first differential transconductor, a positive output coupled to a negative input of the first differential transconductor, and a negative output coupled to a positive input of the first differential transconductor. Each differential transconductor has a negative output impedance. Each differential transconductor includes a current controlled transconductor circuit (CCXG) and a voltage-current converter coupled to a first supply node for providing a current to the CCXG responsive to a voltage applied to a voltage control input of the differential transconductor.

6 Claims, 15 Drawing Sheets

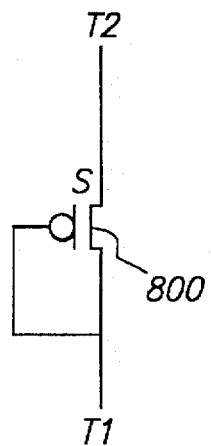 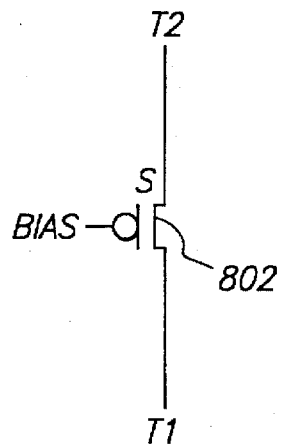 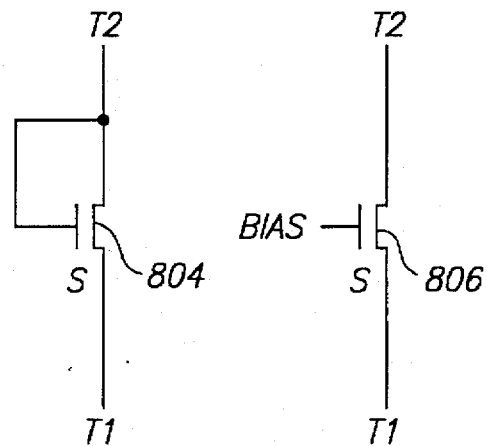
FIG. 8a    FIG. 8b    FIG. 8c    FIG. 8d
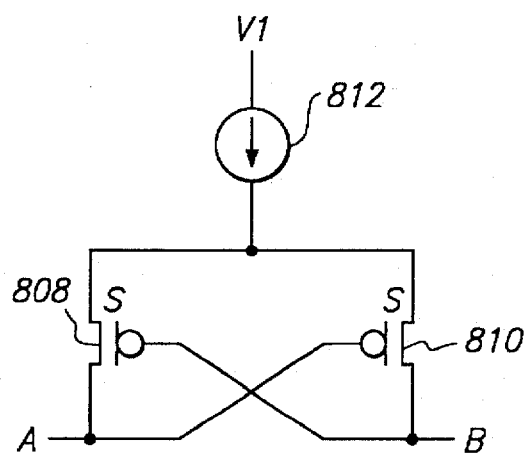 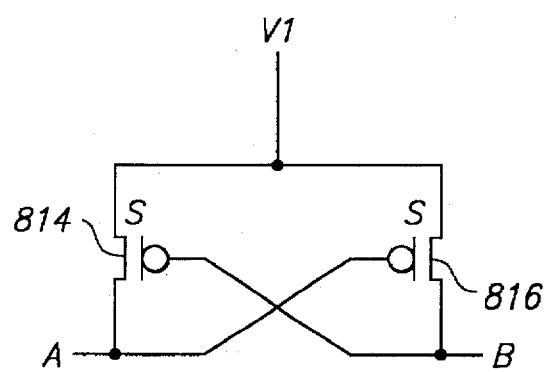
FIG. 8e    fIG. 8f

REGULATED SUPPLY FOR VOLTAGE CONTROLLED OSCILLATOR

This is a divisional of application Ser. No 08/493,799 filed on Jun. 22, 1995and now U.S. Pat. No. 5,576,647.

FIELD OF THE INVENTION

This invention relates to phase-lock loop circuits, and more particularly to phase-lock loop and dock recovery circuits having two-stages and in-phase and quadrature outputs.

BACKGROUND OF THE INVENTION

Phase lock loops typically have a phase detector for providing a control signal indicative of a phase difference between a reference signal and a feedback signal. A charge pump provides a voltage signal responsive to the control signal indicative of the phase difference. A voltage controlled oscillator (VCO) provides an oscillation signal responsive to the voltage signal. The voltage signal is fed back to the phase detector.

Conventional VCOs have multi-stage transconductors cascaded to form a ring. Theoretically, the number of transconductor stages required for sustainable oscillation is three or greater. Higher frequency VCOs use fewer number of stages. Many conventional VCOs, such as those described later herein in conjunction with FIGS. 2, 3 and 4 do not have supply rejection capability and thus are susceptible to supply noise induced jitter. Other conventional VCOs, such as that described later herein in conjunction with FIG. 5 have some level of supply rejection capability. Thermal noise induces intrinsic jitter in all VCOs. Intrinsic jitter may be reduced by using larger circuits which however also consume more power. On the other hand, intrinsic jitter levels of less than 5 picoseconds RMS are commonly achieved with relatively low power consumption. However, extrinsic jitter caused by noise on the supply is hard to control to less than 100 picoseconds. Hence, most designs address the extrinsic jitter of the VCO.

For high frequency operation, either the transconductance of each stage is increased (e.g., through increasing bias current) or the number of stages is reduced. For a given supply voltage, there is an upper limit by which the transconductance of the stage may be increased. This limit is typically reached in phase-lock loop VCOs. Conventional VCO designs must have at least three stages for the VCO to oscillate. If a quadrature output is required, the conventional VCO designs must have at least four stages thereby lowering the highest oscillation frequency.

It is an object of the invention to provide a VCO having two transconductor stages and both increased oscillation frequency and quadrature outputs.

It is an object of the invention to provide a VCO circuit with substantially higher level of supply rejection for lowering the jitter of the VCO.

Conventional charge pumps, such as that shown in FIG. 6, typically work accurately with fast switching characteristics at relatively high current levels, such as 15 microamps or larger. However, at lower charge pump currents and for shorter switching times, a charge injection error and a charge redistribution caused by non-zero parasitic capacitance becomes large relative to the intended charge to be delivered by the charge pump. In current sub-micron integrated circuit processes, the conventional charge pump of FIG. 6 becomes inaccurate for switching times of about 1 to 2 nanoseconds and at a current level of less than about 10 microamps. In applications that are sensitive to static phase error, such as a timing loop in a data recovery circuit in transmission or recording channels, the inability to provide low charge pump current accurately at high speed often results in phase lock loops having large loop filter capacitors. A static phase error is a constant error between the phase of the desired oscillation frequency and the frequency of the signal at which the phase-lock loop is locked. Such a static phase error may occur if the up and down portions of a charge pump are unbalanced. Such large filter capacitors increase the cost of the total circuit in monolithically integrated form. Furthermore, a large area capacitor has an adverse effect on the yield of monolithically integrated phase lock loops, which further exacerbates the manufacturing cost.

It is desirable to have a high frequency phase-lock loop with very low jitter and low static phase error for dock synchronizers. It is desirable to have a phase-lock loop with quadrature outputs for RF applications. It is also desired to provide an improved charge pump circuit that can operate accurately at very low current and high frequency and that allows inexpensive manufacturing of a complete phase lock loop.

In frequency synthesizers, the phase-lock loop circuit may use binary counters. Such circuits often have large transient supply noise that is created when a binary counter executes a major carry, such as from 00000000 to 11111111. It is desirable to have a phase-lock loop that disturbs the power supply to a lesser extent.

SUMMARY OF THE INVENTION

In the present invention, a phase lock loop includes a first pseudo random number based counter for providing a divided reference signal responsive to a reference dock. A phase detector provides a control signal indicative of a phase difference between the divided reference signal and a feedback signal. A charge pump provides a voltage signal responsive to the control signal indicative of the phase difference. A voltage controlled oscillator provides an oscillation signal having a frequency responsive to the voltage signal. A second pseudo random number based counter provides the feedback signal indicative of the frequency of the oscillation signal divided by a predetermined or programmable number.

A voltage controlled oscillator comprises first and second differential transconductors. The second differential transconductor has a positive input coupled to a positive output of the first differential transconductor, has a negative input coupled to a negative output of the first differential transconductor, has a positive output coupled to a negative input of the first differential transconductor, and has a negative output coupled to a positive input of the first differential transconductor. Each differential transconductor has a negative output impedance.

Each differential transconductor comprises a current controlled transconductor circuit (CCXG), and a voltage-current converter coupled to a first supply node for providing a current to the CCXG responsive to a voltage applied to a voltage control input of the differential transconductor. The CCXG comprises a first transistor of the first type which has a drain coupled to the negative output of the CCXG, and has a gate coupled to the positive input of the CCXG. A second transistor of the first type has a drain coupled to the positive output of the CCXG, has a gate coupled to the negative input of the CCXG, and has a source coupled to the source of the first transistor of the first type to form the common source node in the CCXG for receiving the current from the voltage-current converter. A first resistive load couples the negative output of the CCXG to a second supply node. A second resistive load couples the positive output of the CCXG to the second supply node. A negative conductance device has one terminal coupled to the negative output of the CCXG and a second terminal coupled to the positive output of the CCXG. A capacitor couples the common source node to the second supply node.

The negative conductance device has a conductance value sufficiently negative to offset the positive conductance looking from the positive to the negative output of the transconductor through the first and second resistive load devices. The resultant output impedance/conductance of the transconductor is negative.

A voltage regulator regulates a voltage applied thereto and provides the regulated voltage to the voltage controlled oscillator. The voltage regulator comprises a VCO current-draw prediction circuit and a self bias shunt regulator. The current-draw prediction circuit provides most of the current required by the VCO. The shunt regulator provides or sinks any difference between the actual current drawn by the VCO and the current supplied by the VCO current-draw prediction circuit. The VCO current-draw prediction circuit comprises a first transistor of a first type having a gate coupled to the VCO control voltage and having a source coupled to a first supply voltage. The drain of the first transistor of the first type provides a current that is proportional to the current-draw of the VCO. This drain current is applied to the reference input of a multiplying current mirror network which reverses the current flow direction, multiplies the magnitude of the current to equal the expected current-draw of the VCO, and provides the current to the regulated supply node of the VCO. The serf bias shunt regulator has its output coupled to the regulated supply node for the VCO and provides the actual voltage regulation function for the overall regulator.

A bi-directional charge pump comprises a first transistor of a first type which has a gate coupled to a first voltage reference, has a drain coupled to the output node of the charge pump, and has a source coupled to the output of a first high speed switching driver. A first transistor of a second type has a gate coupled to a second voltage reference, has a drain coupled to the output node of the charge pump, and has a source coupled to the output of a second high speed switching driver. The first high speed driver has an input coupled to a first control input of the charge pump circuit. Its output is capable of swinging rapidly to a voltage level very close to a first supply node, thereby turning on the first transistor of the first type quickly. The output of the first high speed driver is also capable of swinging rapidly to another level that will turn off the transistor current quickly. The second high speed driver has an input coupled to a second control input of the charge pump circuit. Its output is capable of swinging rapidly to a voltage level very close to a second supply node, thereby turning on the first transistor of the second type quickly. The output of the first high speed driver is also capable of swinging rapidly to a level that will turn off the first transistor of the second type quickly.

The invention provides a voltage controlled oscillator having a high operating frequency and low jitter. The VCO has a quadrature output that is especially useful for RF applications. The phase lock loop may use low noise pseudo-random number generator based counters for reduced digital noise generation. The charge pump has high precision low current to allow implementation of loop filters having small capacitors to thereby reduce the total cost of silicon or other semiconductor material.

BRIEF DESCRIPTION OF THE DRAWINGS

FIGS. 8a, 8b, 8c, and 8d are schematic diagrams illustrating first through fourth embodiments, respectively, of resistive loads of the differential transconductor of FIG. 7.

FIGS. 8e, 8f, 8g, and 8h are schematic diagrams illustrating first through fourth embodiments of the negative conductance device of the differential transconductor of FIG. 7.

DETAILED DESCRIPTION

Figure 1:
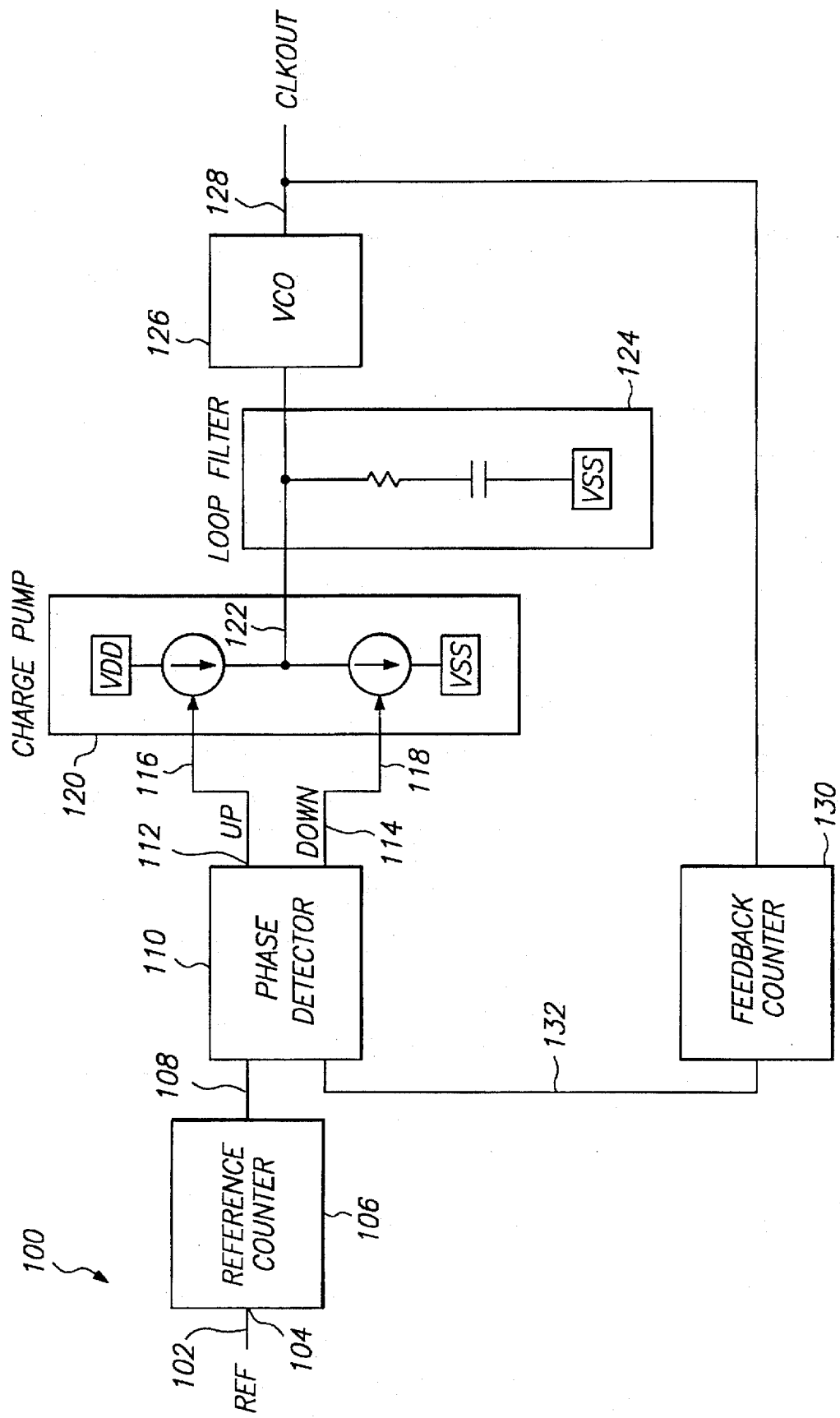
FIG. 1 is a block diagram illustrating a phase lock loop in accordance with the present invention.

Referring to FIG. 1, there is shown a block diagram illustrating a phase lock loop (PLL) circuit 100 in accordance with the present invention. A reference dock 102 is applied to an input terminal 104 of a reference counter 106, which provides a divided reference signal 108 to a phase detector 110. The reference counter 106 may be, for example, a pseudo random number based counter, such as a linear feedback shift register (LFSR). In some implementations, the PLL circuit 100 may not include the reference counter 106, and signals 102 and 108 are identical.

The phase detector 110 provides an up signal 112 and a down signal 114 to respective input terminals 116 and 118 of a charge pump 120 to indicate a positive and negative charge direction, respectively, responsive to a positive or negative difference, respectively, between the phases of the signals applied to the inputs of the phase detector. The phase detector 110 may be a conventional phase detector, a conventional phase-frequency detector, or in data/clock recovery circuits a discrete-time sampled data phase-detector. The charge pump 120 provides a charge pump voltage signal 122 to a loop filter 124 and to a voltage controlled oscillator (VCO) 126. The loop filter 124 preferably comprises a capacitive integrator. An output oscillation signal 128 from the VCO 126 is provided to a feedback counter 130, which provides a feedback signal 132 indicative of the frequency of the oscillation signal 128 divided by a predetermined number to the phase detector 110. The feedback counter 130 may be, for example, a pseudo random number based counter, such as a LFSR. In some cases, for example in data recovery circuits, the PLL circuit 100 may not include the feedback counter 130 and signals 128 and 132 are identical.

The phase lock loop circuit 100 may be used, for example, in an RF synthesizer or a clock/data recovery system in which a clock and data are recovered from a signal from a recording or communication channel (not shown).

In a monolithic integrated frequency synthesizer application, an LFSR generates less digital noise than a conventional binary counter. LFSRs typically are less complex, operate faster, and consume less power than conventional binary counters. A pseudo-random number generator counter has less large current shifts from large shifts in numbers between 0 and 1. Because they have a lower current draw, LFSRs run quieter than conventional binary counters.

Figure 2:
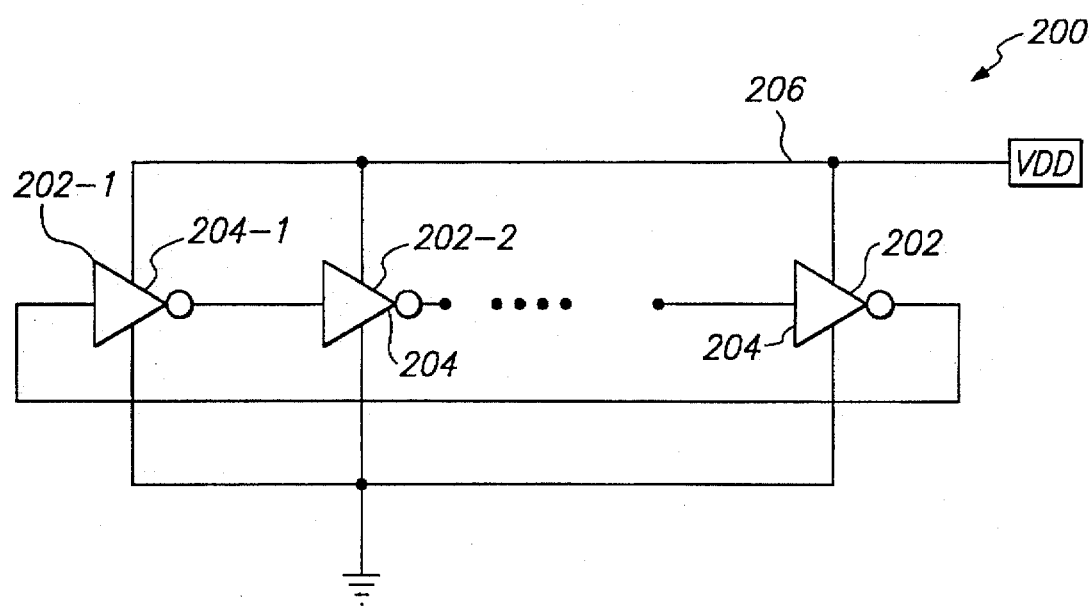
FIG. 2 is a schematic diagram illustrating a first conventional VCO.

Referring to FIG. 2, there is shown a schematic diagram illustrating a first conventional VCO 200. The VCO 200 is an inverter based ring oscillator. The VCO 200 comprises a plurality of transconductor stages 202-1 through 202-n. Each transconductor stage 202 includes an inverter 204 having an output coupled to the input of the inverter 204 of the next transconductor stage. The output of the inverter 204 of the last transconductor stage 202-n is fed back to the input of the inverter 204 of the first transconductor stage 202-1. The number of stages n is an odd number equal to or greater than 3. Each transconductor stage 202 is coupled to a power line 206 to which a voltage Vdd is applied. Changes in the voltage Vdd changes the oscillation frequency of the VCO 200. The oscillation frequency has jitter from ripple on the voltage Vdd.

Figure 3:
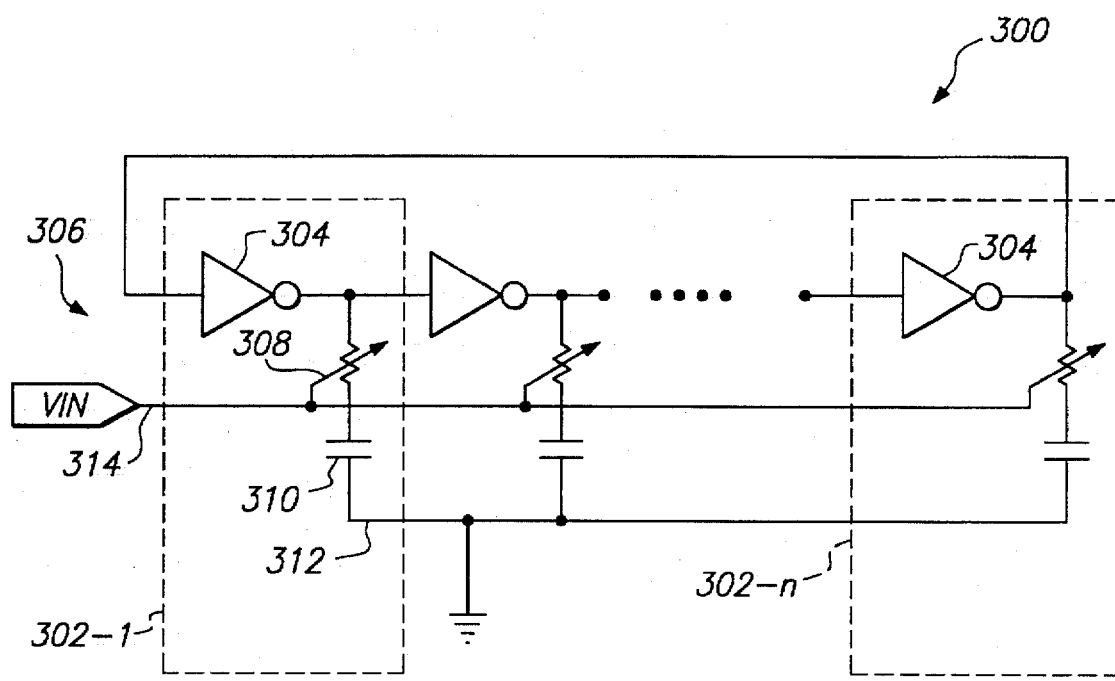
FIG. 3 is a diagram illustrating a second conventional VCO.

Referring to FIG. 3, there is shown a schematic diagram illustrating a second conventional VCO 300. The VCO 300 is an inverter based ring oscillator with variable load frequency tuning. The VCO 300 comprises a plurality of transconductor stages 302-1 through 302-n. The number of stages n is an odd number three or greater. Each transconductor stage 302 includes an inverter 304 having an output coupled to the input of the next inverter 304. The output of the inverter 304 of the last transconductor stage 302-n is fed back to the input of the inverter 304 of the first transconductor stage 302-1. The output of each inverter 304 has a variable load 306 coupled to ground for tuning the oscillation frequency. Each variable load 306 comprises a voltage controlled resistive device 308 in series with a capacitor 310 coupled to ground 312. An input voltage $V_{in}$ is applied to the voltage controlled resistive device 308 to vary the resistance of the resistive device 308 to thereby vary the oscillation frequency of the VCO 300.

Figure 4:
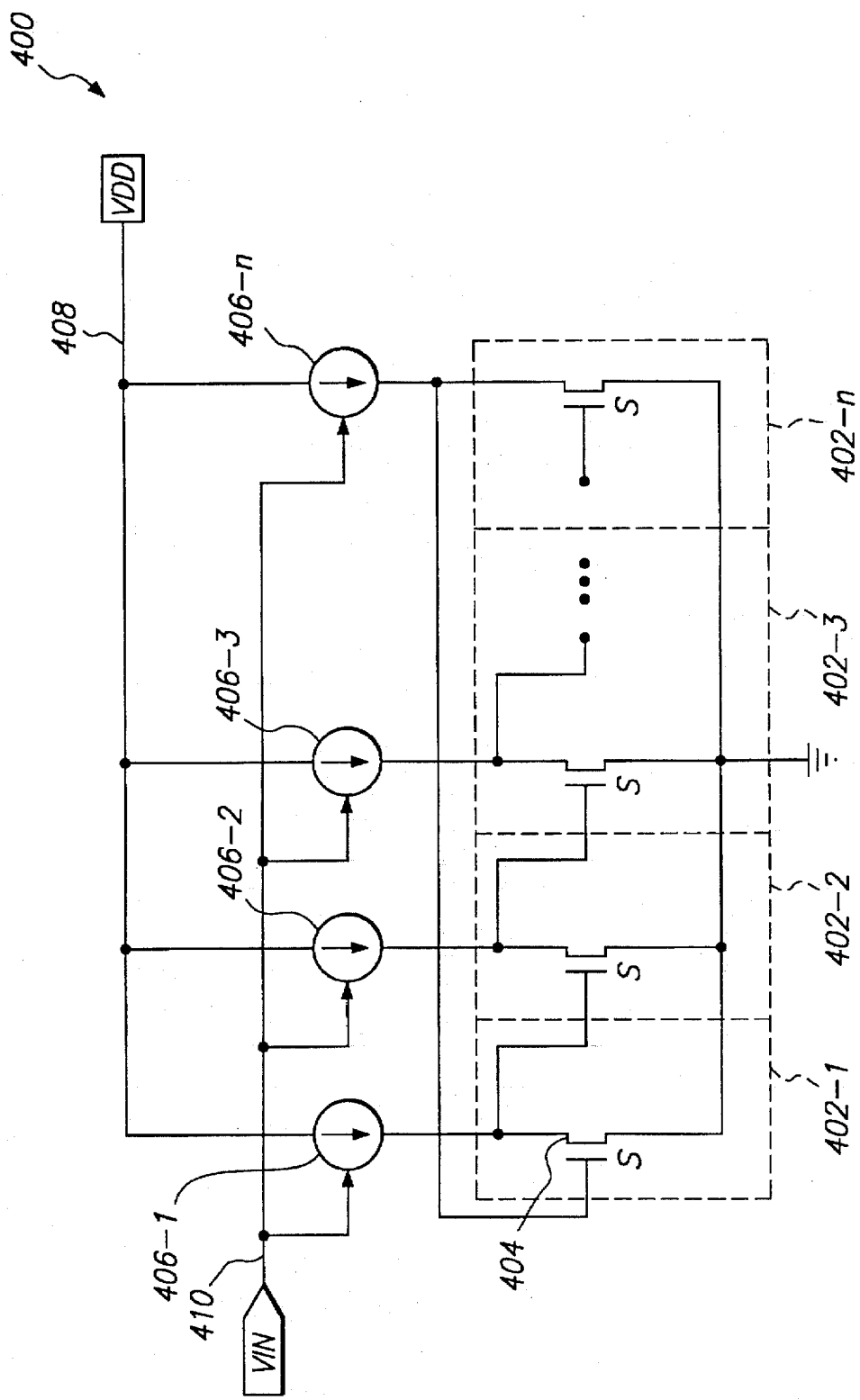
FIG. 4 schematic diagram illustrating a third conventional VCO.

Referring to FIG. 4, there is shown a schematic diagram illustrating a third conventional VCO 400. The VCO 400 is a single ended current controlled transconductor ring oscillator. The VCO 400 comprises a plurality of transconductor stages 402-1 through 402-n. The number of stages n is an odd number three or more. Each transconductor stage 402 includes a FET inverter 404 having an output coupled to the gate of the FET inverter 404 of the next transconductor stage. The output of the inverter 404 of the last transconductor stage 402-n is fed back to the gate of the first FET inverter 404-1. Variable bias current sources 406-1 through 406-n couple the corresponding FET inverter 404-1 through 404-n to a signal line 408, which is coupled to a first power supply (not shown) which supplies a voltage Vdd. The variable bias current sources 406-1 through 406-n may be, for example, FET transistors. A tuning voltage is applied to a line 410 that is coupled to control inputs of the variable bias current sources 406-1 through 406-n for varying the current of the variable bias current source to thereby vary the transconductance of the transconductors 402. Variations of the current to the transconductors 402 tune the oscillation frequency of the VCO 400.

Figure 5:
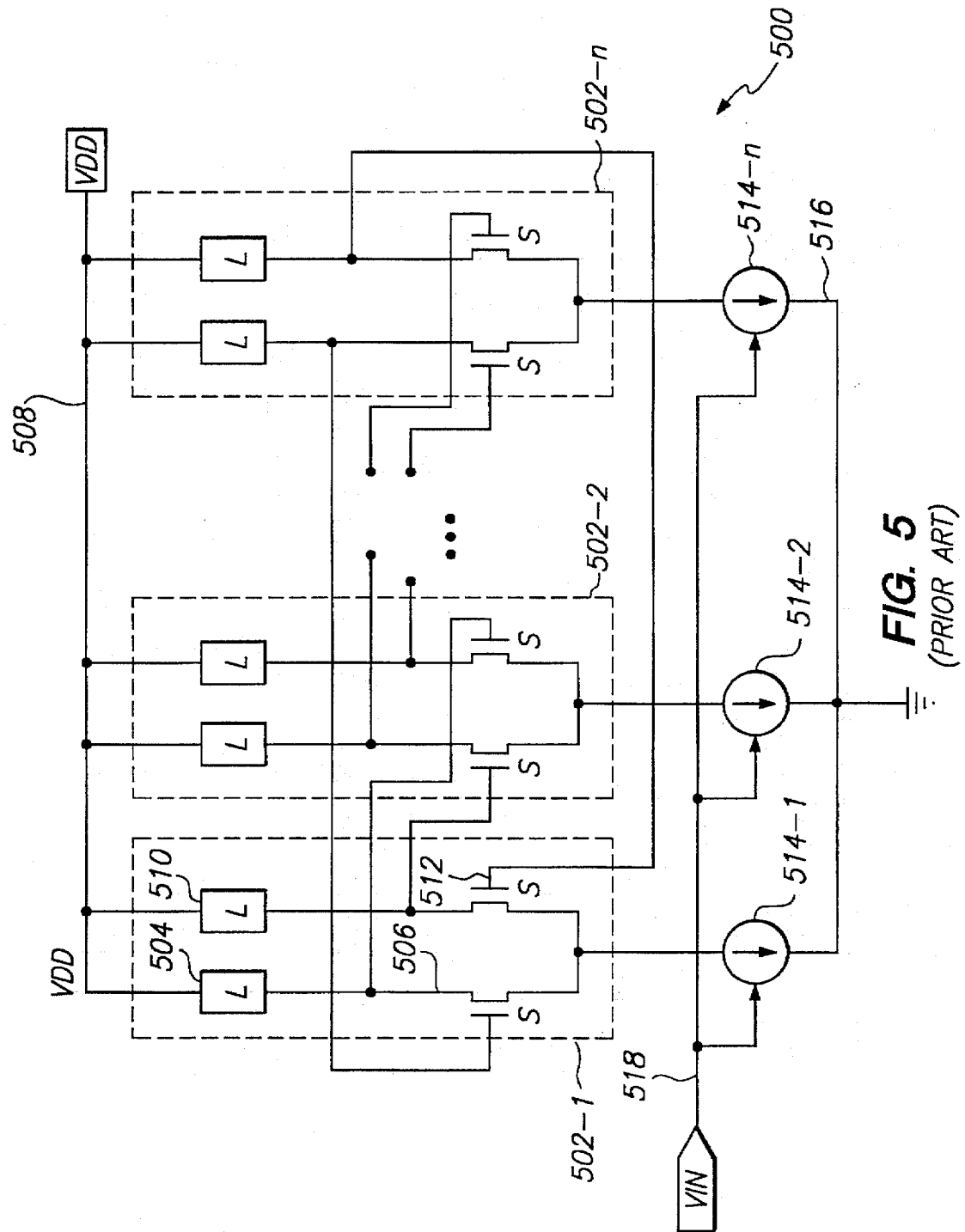
FIG. 5 is a schematic diagram illustrating a fourth conventional VCO.

Referring to FIG. 5, there is shown a schematic diagram illustrating a fourth conventional VCO 500. The VCO 500 is a differential transconductor ring oscillator. The VCO 500 comprises a plurality of transconductor stages 502-1 through 502-n. The number of stages n may be any number (odd or even) three or greater. Each transconductor stage 502 is a differential stage. Each transconductor stage 502 includes a first load 504 coupling the drain terminal of a FET transistor 506 to a voltage line 508, which is coupled to a first power supply (not shown) that provides a voltage Vdd. A second load 510 couples the drain terminal of a FET transistor 512 to the voltage line 508. The drain terminal of the FET transistor 506 is coupled to the gate of the FET transistor 512 of the next transconductor stage. The drain terminal of the FET transistor 506 of the last transconductor stage 502-n is fed back to the gate terminal of the FET transistor 506 of the first transconductor stage 502-1. Similarly, the drain terminal of the FET transistor 512 is coupled to the gate of the FET transistor 506 of the next transconductor stage. The drain terminal of the FET transistor 512 of the last transconductor stage 502-n is fed back to the gate terminal of the FET transistor 512 of the first transconductor stage 502-1. Variable bias current sources 514-1 through 514-n couple the common node of the source terminal of the corresponding FET transistors 506-1 through 506-n to a signal line 516, which is coupled to a second power supply (not shown) that provides a voltage Vss. The variable bias current sources 514-1 through 514-n may be, for example, FET transistors. A tuning voltage is applied to a line 518 that is coupled to the variable bias current sources 514-1 through 514-n for varying the current of the variable bias current source to thereby vary the transconductance of the transconductors 502. Variations of the current to the transconductors 502 tunes the oscillation frequency of the VCO 500.

Figure 6:
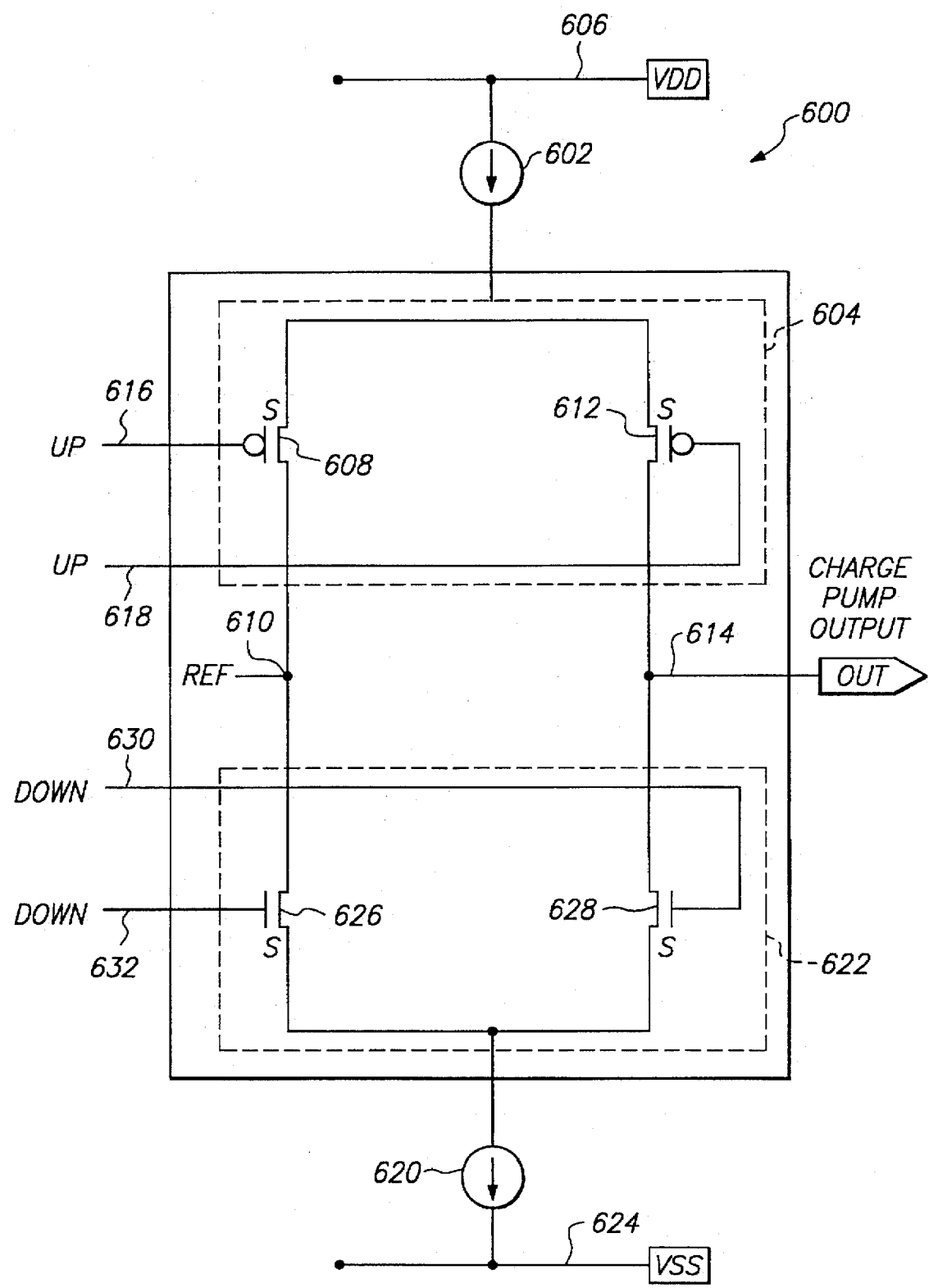
FIG. 6 is a schematic diagram illustrating a conventional charge pump circuit.

Referring to FIG. 6, there is shown a schematic diagram illustrating a conventional charge pump circuit 600. The charge pump circuit 600 has a first current source 602 coupling a first differential switch 604 to a first power line 606 to which a voltage Vdd is applied. The first differential switch 604 comprises a first p-channel transistor 608 having a drain-source junction that couples the first current source 602 to a reference terminal 610 and comprises a second p-channel FET transistor 612 having a drain-source junction that couples the first current source 602 to an output terminal 614. An up signal 616 is applied to the gate of the first transistor 608. An inverted up signal 618 is applied to the gate of the second transistor 612. The up signal 616 may be the up signal 112 from the phase detector 110.

A second current source 620 couples a second differential switch 622 to a second power line 624 to which a voltage VSS is applied. The second differential switch 622 comprises a first n-channel transistor 626 having a drain-source junction that couples the second current source 620 to the reference terminal 610 and comprises a second n-channel FET transistor 628 having a drain-source junction that couples the second current source 620 to the output terminal 614. A down signal 630 is applied to the gate of the second transistor 628. An inverted down signal 632 is applied to the gate of the first transistor 626. The down signal 630 may be the down signal 114 from the phase detector 110.

Figure 7:
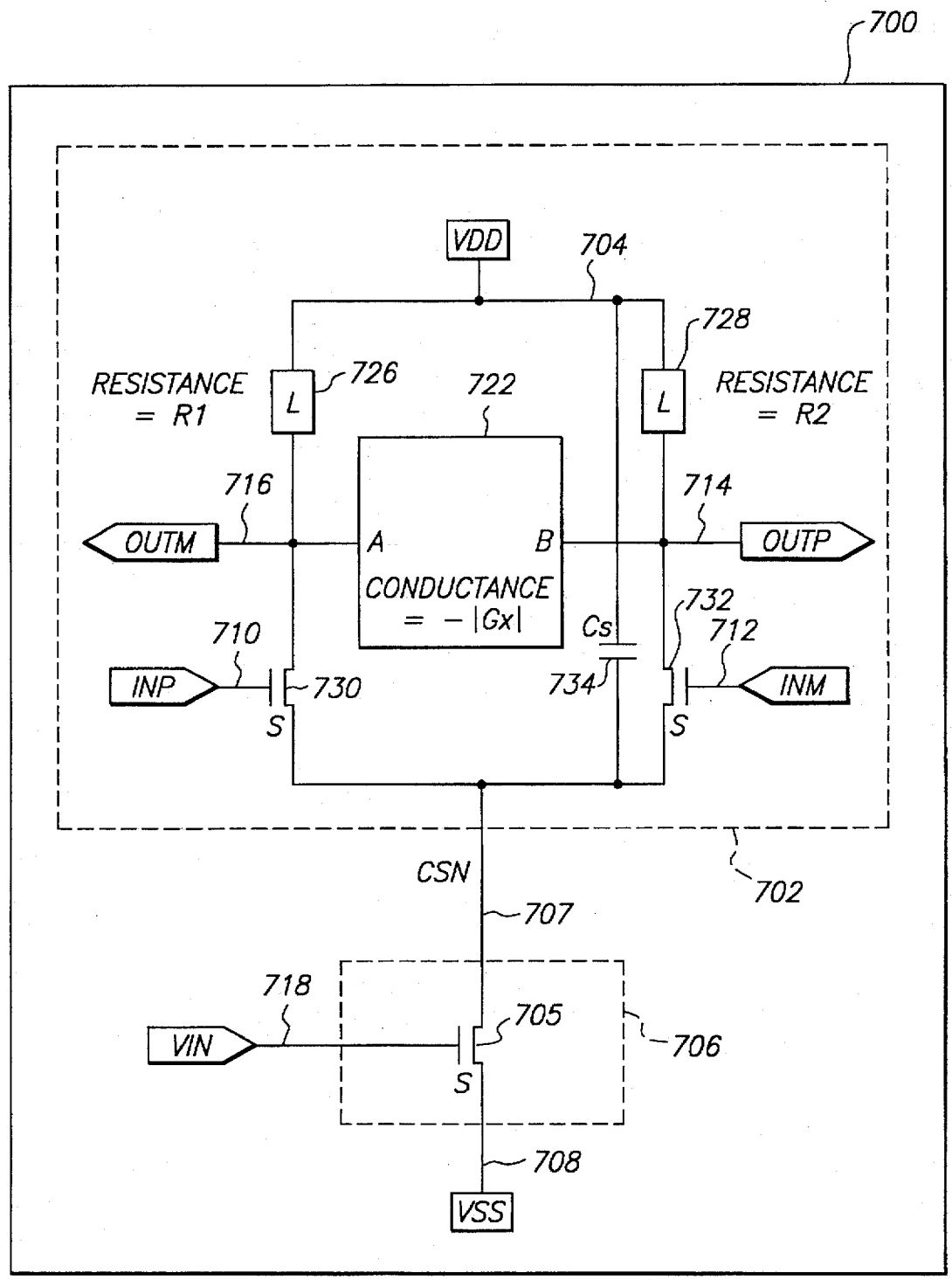
FIG. 7 is a schematic diagram of a differential transconductor with negative output impedance in accordance with the present invention.

Referring to FIG. 7, there is shown a schematic block diagram illustrating a differential transconductor 700 with negative output conductance. The differential transconductor 700 comprises a current controlled differential transconductor (CCXG) 702 coupled to a voltage-current converter 706. The voltage-current converter 706 may be, for example, a transistor 705 having a gate coupled to a voltage control input 718 of the differential transconductor 700, having a source coupled to a first power supply line or a supply node 708, and having a drain coupled to a common source node 707.

The CCXG 702 has a differential pair comprising transistors 730 and 732. The transistor 730 has a gate coupled to a positive input 710 of the differential transconductor 700 and has a drain coupled to a negative output 716 of the differential transconductor 700. The transistor 732 has a gate coupled to a negative input 712 of the differential transconductor 700, has a drain coupled to a positive output 714 of the differential transconductor 700, and has a source coupled to the source of transistor 730 at the node 707. A first resistive load 726 couples the negative output 716 of the differential transconductor 700 to a second power supply line or supply node 704. A second resistive load 728 couples the positive output 714 of the differential transconductor 700 to the second power supply line 704. A negative conductance device 722 couples the negative output 716 to the positive output 714 of the differential transconductor 700. The negative conductance device has a negative conductance that is greater than the total conductance of the resistive loads 726 and 728.

A capacitor 734 couples the second power supply line 704 to the common source node 707 of the CCXG 702 to reduce the effect of parasitic voltage-dependent junction capacitance at the common source node 707. Variations in the parasitic capacitance at the node 707 changes the frequency of an oscillator having the differential transconductor 700 (such as the oscillator described below in conjunction with FIG. 9), if the size of the parasitic capacitance is relatively small. Variations in the supply voltage modulate the parasitic junction capacitance and thus change the oscillation frequency. By increasing the total capacitance at the node 707, the capacitor 734 reduces the sensitivity of the oscillation frequency to modulation of the junction capacitance to thereby reduce the jitter of the oscillation frequency. The capacitor 734 is placed across node 707 and the supply at the load side (the power line 704) instead of the first supply line 708 across the voltage-current converter 706. In the latter configuration, the jitter caused by the transconductance modulation of the transistors 730 and 732 may become dominant in the presence of supply noise.

Transistors 730 and 732 are shown as FETs in FIG. 7. They may also be bipolar transistors in a BiCMOS implementation.

Referring to FIG. 8a, there is shown a schematic diagram illustrating a first embodiment of the resistive loads 726 and 728. The resistive load 726, 728 is a diode load comprising a diode configured PFET 800 having the drain coupled to the gate.

Referring to FIG. 8b, there is shown a schematic diagram illustrating a second embodiment of the resistive loads 726 and 728. The resistive load 726, 728 is a linear load comprising a PFET 802 having a gate for receiving a bias voltage.

Referring to FIG. 8c, there is shown a schematic diagram illustrating a third embodiment of the resistive loads 726 and 728. The resistive load 726, 728 is a diode load comprising a diode configured NFET 804 having the drain coupled to the gate.

Referring to FIG. 8d, there is shown a schematic diagram illustrating a fourth embodiment of the resistive loads 726 and 728. The resistive load 726, 728 is a linear load comprising a NFET 806 having a gate for receiving a bias voltage.

Referring to FIG. 8e, there is shown a schematic diagram illustrating a first embodiment of the negative conductance device 722. The negative conductance device 722 includes a pair of PFETs 808 and 810 having the gate of one FET coupled to the drain of the other FET. The common node of the sources of the FETs 808 and 810 both are coupled to an output terminal of a current source 812.

Referring to FIG. 8f, there is shown a schematic diagram illustrating a second embodiment of the negative conductance device 722. The negative conductance device 722 includes a pair of PFETs 814 and 816 having the gate of one FET coupled to the drain of the other FET and having the sources of both FETs coupled to a power supply line V1.

Figure 8G:
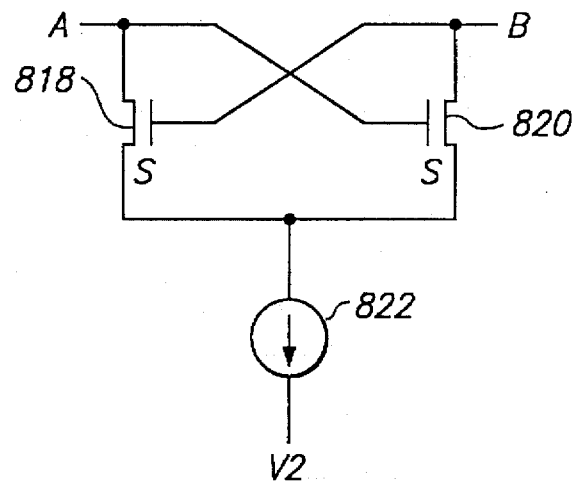

Referring to FIG. 8g, there is shown a schematic diagram illustrating a third embodiment of the negative conductance device 722. The negative conductance device 722 includes a pair of NFETs 818 and 820 having the gate of one FET coupled to the drain of the other FET. The common node of the sources of the FETs 818 and 820 both are coupled to an output terminal of a current source 822.

Figure 8H:
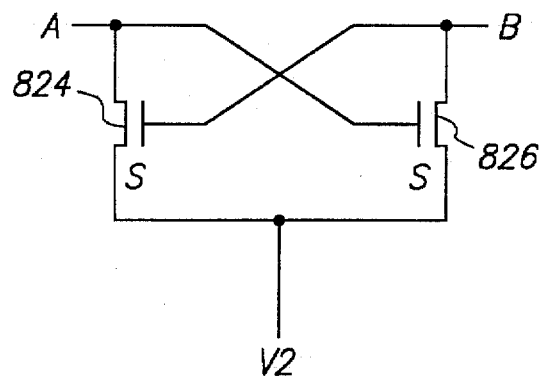

Referring to FIG. 8h, there is shown a schematic diagram illustrating a fourth embodiment of the negative conductance device 722. The negative conductance device 722 includes a pair of NFETs 824 and 826 having the gate of one FET coupled to the drain of the other FET and having the sources of both FETs coupled to a power supply line V2.

Figure 16:
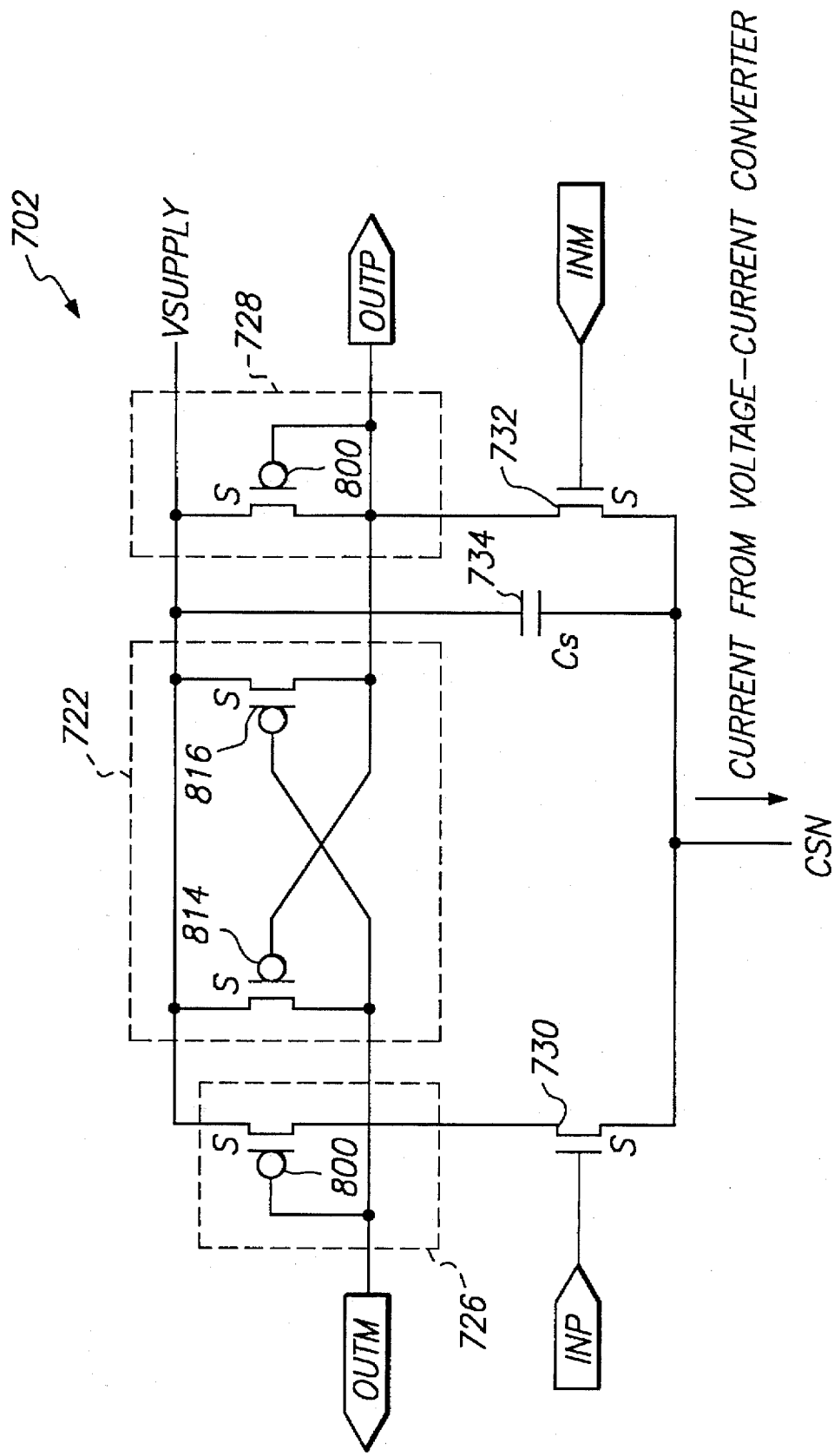
FIG. 16 is a schematic diagram illustrating a current controlled differential transconductor having NFET input devices.

Referring to FIG. 16, there is shown a schematic diagram illustrating a CCXG 702 having the PFET cross coupled device 722 of FIG. 8f and the PFET resistive loads 726 and 728 of FIG. 8a, and NFET or NPN bipolar transistor 730 and 732 for the input differential pair. In order to obtain a negative output conductance for the CCXG 702, the width to length (W/L) ratio of the cross-couple transistor pair 814 and 816 is greater than the (W/L) ratio of the transistors 800 of the resistive loads 726 and 728.

Figure 17:
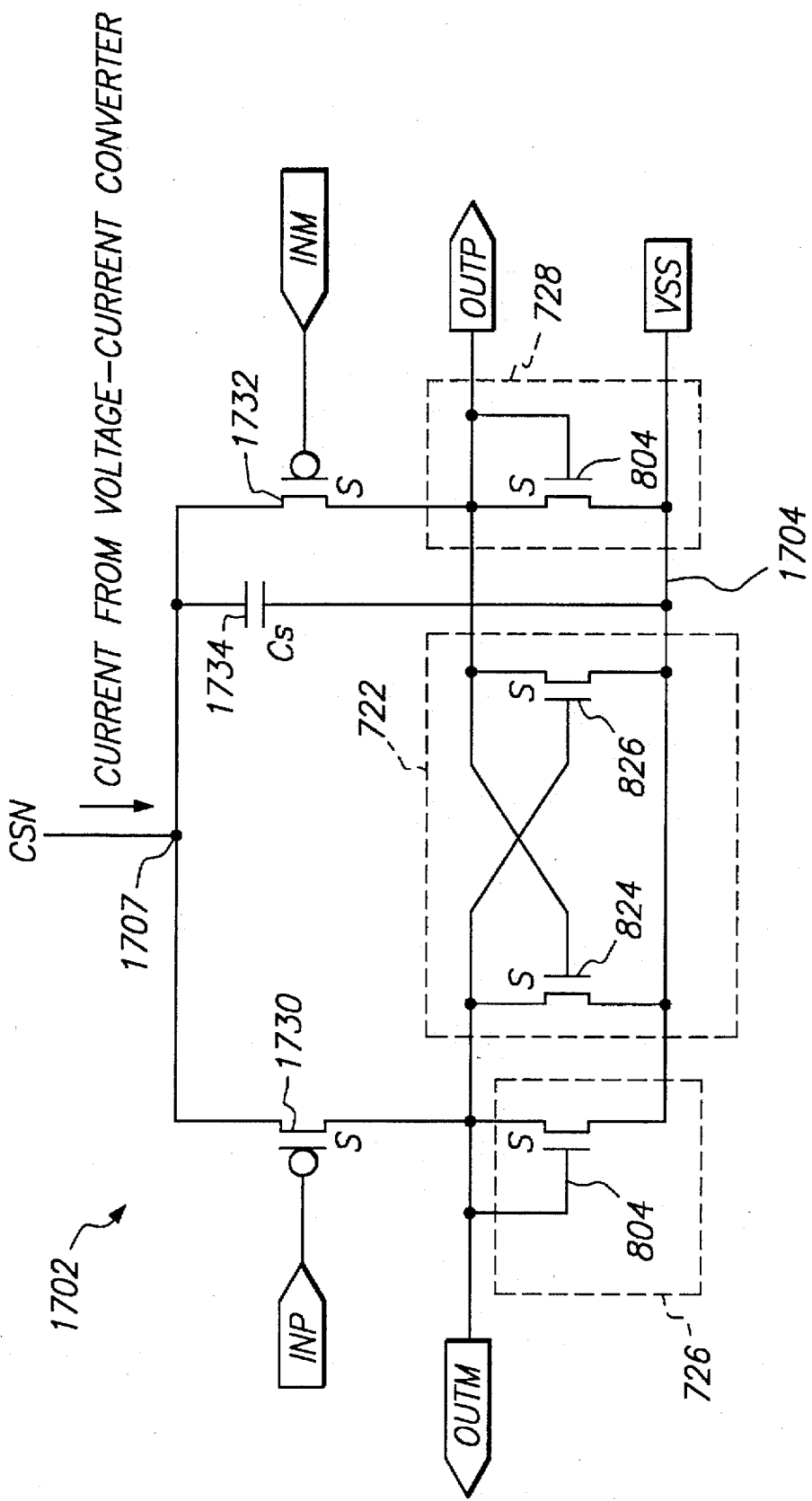
FIG. 17 is a schematic diagram illustrating a current controlled differential transconductor having PFET input devices.

Referring to FIG. 17, there is shown a schematic diagram illustrating a p-type CCXG 1702 having the NFET cross coupled device 722 of FIG. 8h and the resistive loads 726 and 728 of FIG. 8c and PFETS or PNP bipolar transistors 1730 and 1732 for the input differential pair. A capacitor 1734 couples a first power line 1704 to a common source node 1707 of the CCXG 1702. In order to obtain negative output conductance for the CCXG 1702, the width to length (W/L) ratio of the cross-couple transistor pair 824 and 826 is greater than the (W/L) ratio of the transistors 804 of the resistive loads 726 and 728.

Figure 9:
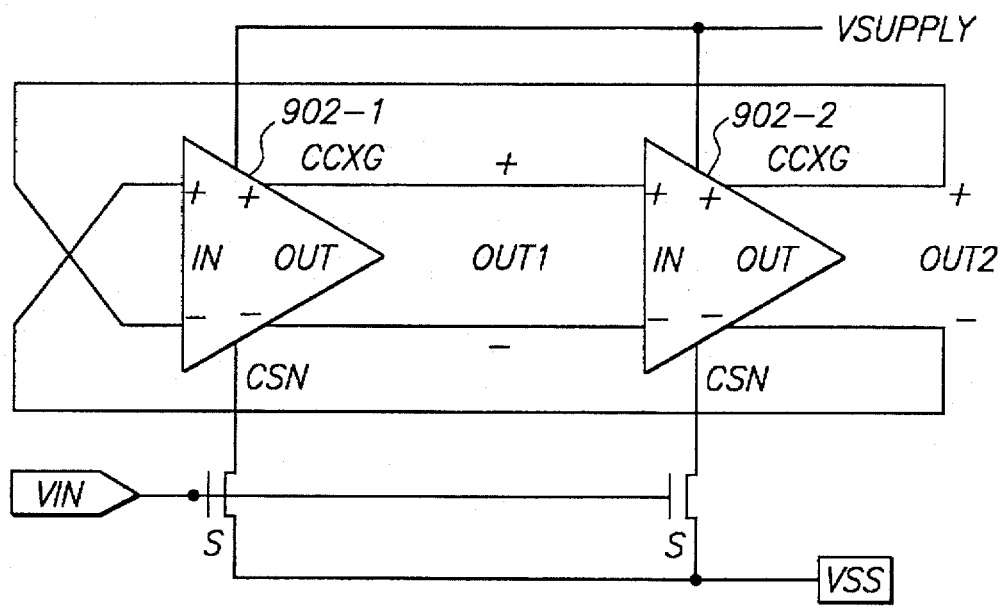
FIG. 9 is a block diagram illustrating a two transconductance stage VCO.

Referring to FIG. 9, there is shown a block diagram illustrating a two transconductance stage VCO. The two-stage oscillator 900 includes first and second differential transconductors 902-1 and 902-2. As illustrated in FIG. 9, the differential transconductors 902-1 and 902-2 both comprise an n-type CCXG 702 of FIG. 16 and an n-type voltage-current converter 706. Alternatively, the oscillator 900 may comprise the p-type CCXG 1702 of FIG. 17 and a p-type voltage-current converter 706. Positive and negative output terminals of the first differential transconductor 902-1 are coupled to respective positive and negative input terminals of the second differential transconductor 902-2. A positive output terminal of the second differential transconductor 902-2 is fed back to a negative input terminal of the first differential transconductor 902-1. A negative output terminal of the second differential transconductor 902-1 is fed back to a positive input terminal of the first differential transconductor 902-1. Each differential transconductor 902 has a voltage input terminal for receiving a control voltage to vary the transconductance of the differential transconductor 902. Each differential transconductor 902 has negative output conductance. The output of the transconductor 902-1 is in quadrature (90 degrees out of phase) with the output of the other transconductor 902-2. The in-phase and the quadrature outputs may be used in an RF receiver.

Figure 10:
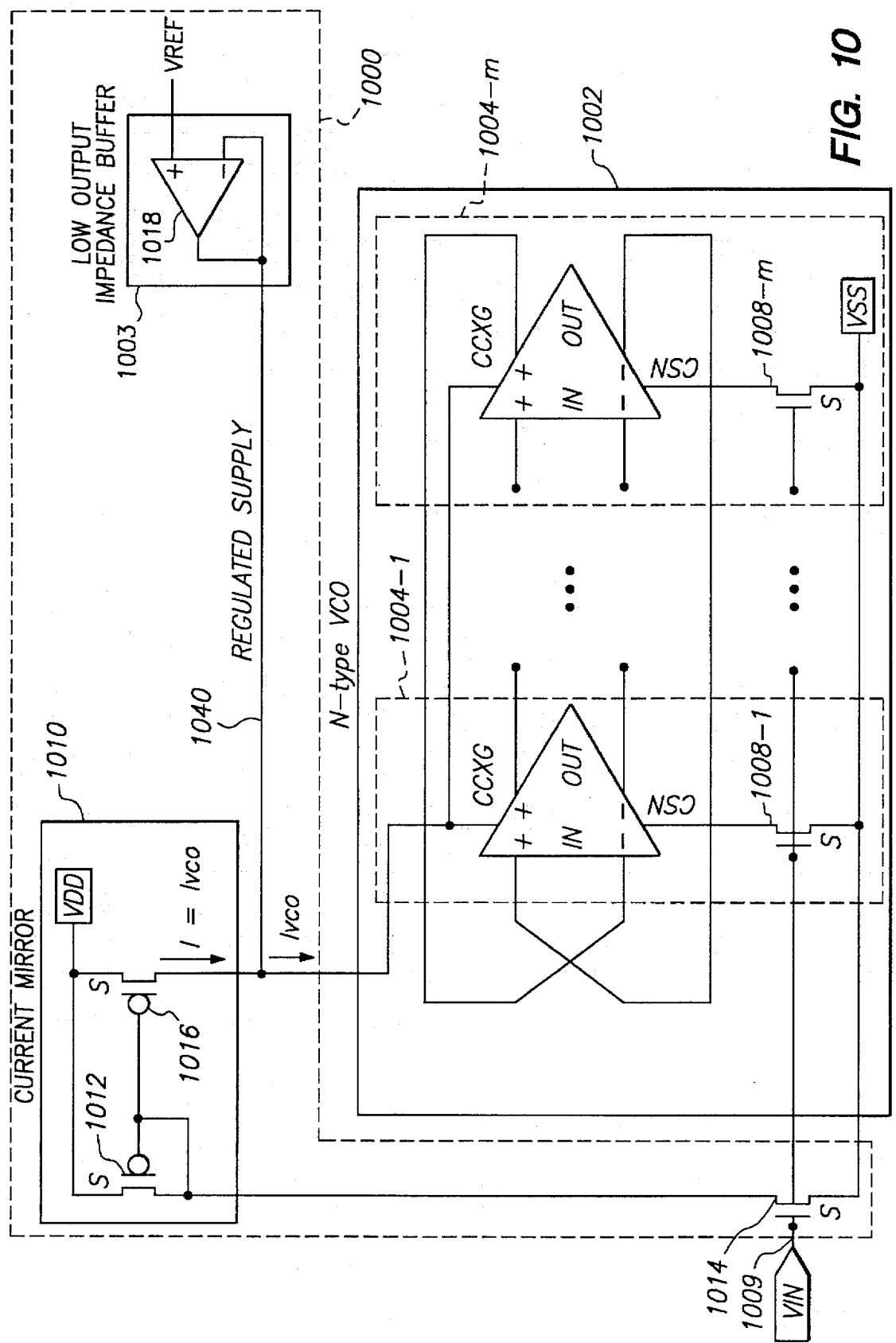
FIG. 10 is a schematic diagram illustrating a voltage regulator for a VCO implemented using the n-type current controlled differential transconductor of FIG. 16.

Referring to FIG. 10, there is shown a schematic diagram illustrating a voltage regulator 1000 for regulating the voltage applied to a VCO 1002 with multiple differential transconductor stages 1000-1 through 1000-m to reduce the jitter of the oscillation frequency of the VCO 1002. Each differential transconductor 1000 may be, for example, a differential transconductor 902-1. The voltage regulator 1000 and the VCO 1002 may be fabricated in an N-Well CMOS integrated circuit. The voltage regulator 1000 uses feed-forward bias current cancellation in conjunction with a low output impedance voltage buffer 1003.

Each differential transconductor 1004-1 through 1004-m comprises a respective voltage-to-current converter 1008-1 through 1008-m, which are each controlled by a voltage applied to an input line 1009. The total current drawn by the voltage-current converters 1008-1 through 1008-m is approximately the current-draw of the VCO 1002. The voltage regulator 1000 comprises a multiplying current mirror 1010. The current mirror 1010 preferably comprises two p-channel FETs 1012 and 1016. A voltage-current converter 1014 provides a reference current to the current mirror 1010. The voltage-current converter 1014 preferably comprises a transistor that is substantially the same size as the transistors 1008-1 through 1008-m. The current mirror 1010 provides a current that is a multiplied version of the reference current back into the regulated supply line 1040 of the VCO 1002. By suitably sizing the transistors 1014, 1012 and 1016 in a conventional manner, the output of the current mirror 1010 provides a current approximately equal to the current predicted to be drawn by the VCO 1002. The difference between the current-draw of the VCO 1002 and the current delivered by the current mirror 1010 is the error current of the current-draw. The low output impedance voltage buffer 1003 absorbs or sinks the error current from the current-draw cancellation. Since the error current is small compared to the current-draw of the VCO 1002, the low output impedance voltage buffer 1003 can be small.

The low output impedance buffer 1003 may be, for example, an operational amplifier 1018 having a positive input coupled to a reference voltage and a negative input coupled to its own output and the regulated supply node of the VCO. The buffer 1003 preferably is a voltage regulator 1200 illustrated in FIG. 12 below.

A P-WELL CMOS implementation of the regulated VCO with a circuit topology similar to that of FIG. 10 can be designed by simply exchanging all NFETs with PFETs, all NPNs with PNPs, and vice versa, and exchanging the polarity of the main power supply lines.

Figure 11:
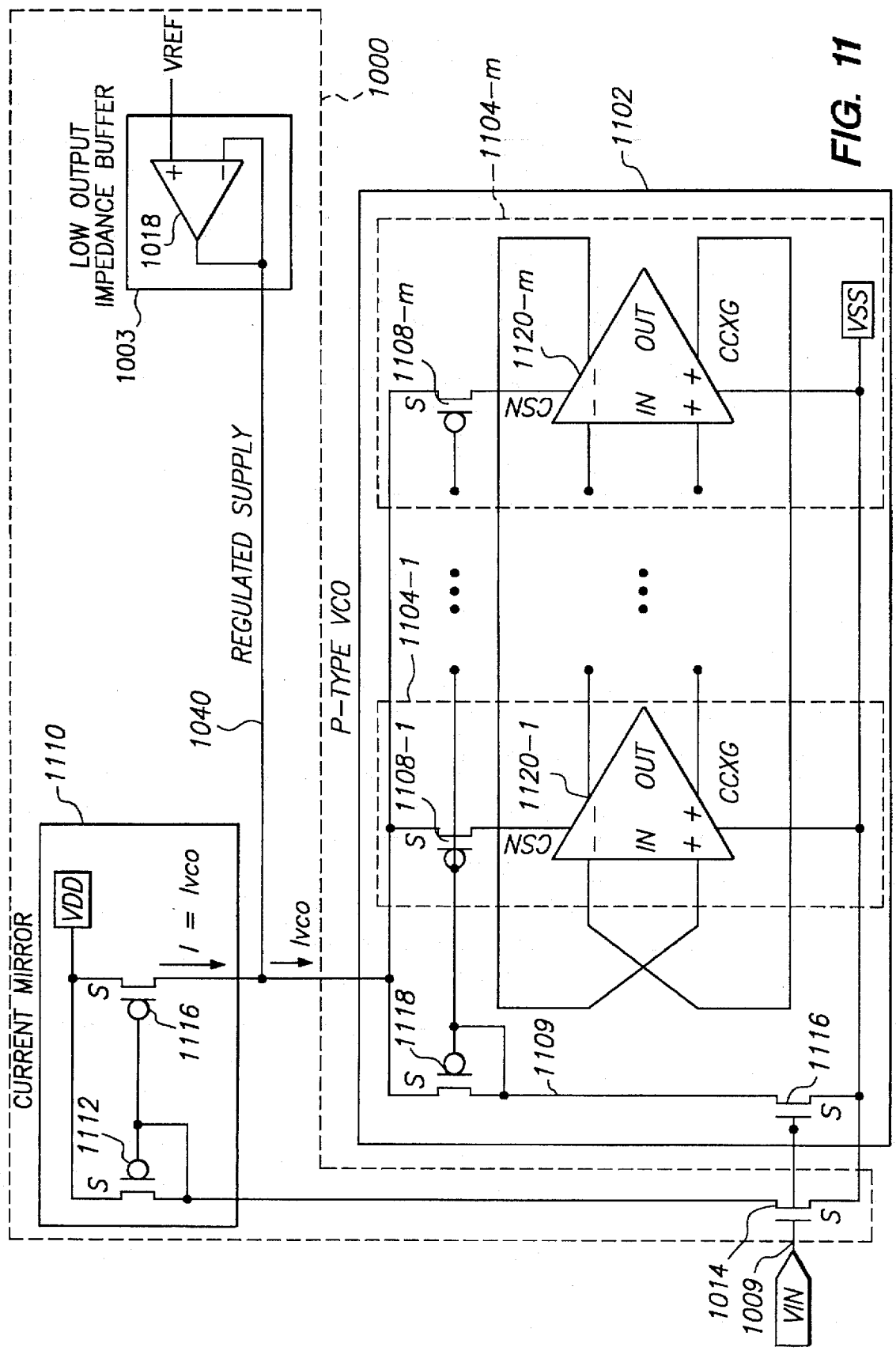
FIG. 11 is a schematic diagram illustrating a voltage regulator for a VCO implemented using the p-type current controlled differential transconductor of FIG. 17.

Referring to FIG. 11, there is shown a schematic diagram illustrating a voltage regulator 1000 for regulating the voltage applied to a VCO 1102 with multi-differential transconductor stages 1104-1 through 1104-m to reduce the jitter of the VCO 1102. Each differential transconductor 1104 comprises a p-type CCXG 1120 and p-type voltage-current converter 1108. The voltage regulator 1000 and the VCO 1102 may be fabricated in art N-Well CMOS/BiCMOS integrated circuit. The voltage regulator 1000 uses feed-forward bias current cancellation in conjunction with a low output impedance voltage buffer 1003.

Each differential transconductor 1104-1 through 1104-m comprises a voltage-to-current converter 1108-1 through 1108-m, which are all controlled by a voltage applied to an input line 1109, which in turn is controlled by voltage applied to the signal line 1009 through an NFET 1116. The total current drawn by the voltage-current converters 1108-1 through 1108-m and the transistor 1118 is the current-draw of the VCO 1102.

The voltage regulator 1000 comprises a multiplying current mirror 1110. The current mirror 1110 preferably comprises two p-channel FETs 1112 and 1116. The current mirror 1110 receives its reference current from the voltage-current converter 1014, which is preferably the same sized transistor as the transistor 1116. The current mirror 1110 delivers a multiplied version of the reference current back into the regulated supply line 1040 of the VCO 1102. By suitably sizing the transistors 1014, 1112 and 1116 output of the current mirror 1110 provides a current approximately equal to the current consumed by the VCO 1102. The difference between the current-draw of the VCO 1102 and the current delivered by the current mirror 1110 is the error current from the current-draw cancellation. The low output impedance voltage buffer 1003 absorbs or sinks the error current from the current-draw cancellation. Since the error current is small compared to the current-draw of the VCO 1102, the low output impedance voltage buffer 1003 can be small.

A P-WELL CMOS implementation of the regulated VCO with a circuit topology similar to that of FIG. 11 can be designed by simply exchanging all NFETs with PFETs, PNPs with NPNs, and vice versa, and exchanging the polarity of the main power supply lines.

Figure 12:
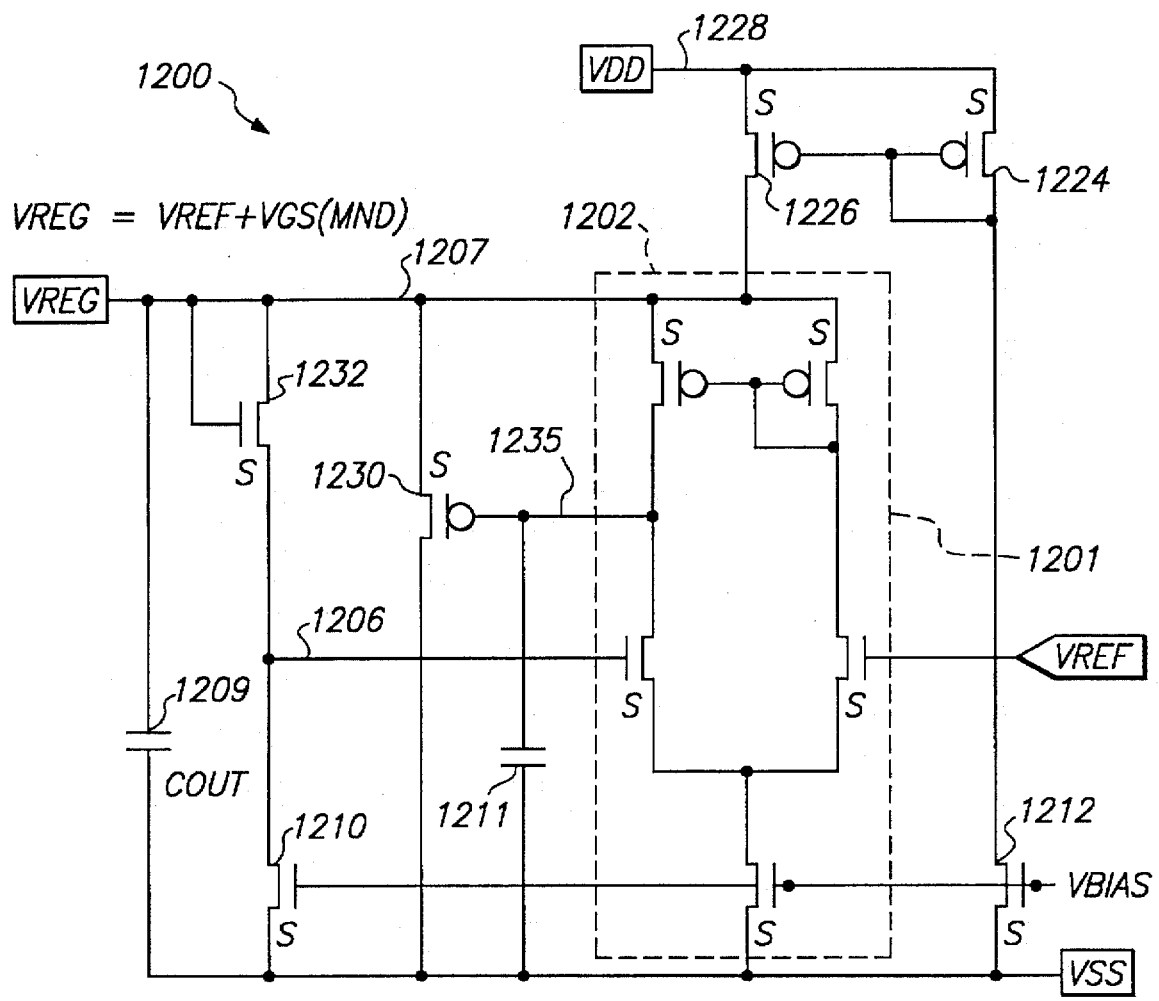
FIG. 12 is a schematic diagram illustrating a serf-bias shunt regulator, which is the preferred embodiment of the low output impedance buffer of FIG. 10 and FIG. 11.

Referring to FIG. 12, there is shown a schematic diagram illustrating a self-bias shunt regulator 1200. The self-bias shunt regulator 1200 is the preferred embodiment of the low output-impedance voltage buffer 1003 of FIG. 10 and FIG. 11.

The self-bias shunt regulator 1200 provides a regulated voltage having a very high supply rejection capability, equal to or better than an operational amplifier with cascoded output to provide a higher degree of voltage regulation at its output. However, the self-bias shunt regulator 1200 achieves high supply rejection without the use of cascoded transistors, allowing output regulation with a low voltage drop from the voltage of the unregulated supply. A higher regulated output voltage allows the VCOs 1002 or 1102 to operate at higher frequency while maintaining supply rejection for the output jitter of the VCO.

The self-bias regulator 1200 comprises a common single stage operational amplifier 1202, a current source transistor 1226, a current shunting transistor 1230, a voltage shifting transistor 1232 and bias current transistors 1212, 1224 and 1210. The current drawn by the current source transistor 1226 from a main power line 1228 supplies the current-draw of the operational amplifier 1202, the voltage shifter 1232 and an external load, such as the VCO of FIG. 10 or FIG. 11. Any excess current is consumed by the shunting transistor 1230. A reference voltage $V_{ref}$ is applied to a first (positive) input 1201 of the operational amplifier 1202. A feedback voltage is applied to a second (negative) input 1206 of the operational amplifier 1202. The output 1235 of the operational amplifier 1202 controls the shunting transistor 1230. When the output voltage on an output 1207 drops due to a change in loading condition, the level shifted version on the input 1206 also drops, thereby causing the operational amplifier 1202 to raise the voltage of the output 1235, which causes the shunting transistor 1230 to consume less current, which in turn raises the regulated output voltage on 1207. Since the operational amplifier 1202 receives a supply voltage from the regulated supply node 1207, it is immune to supply changes on the main power line 1228. This allows the serf-bias shunt regulator 1200 to have a very high degree of regulation that is immune to ripples on the main supply line 1228. A capacitor 1209 couples the output 1207 to ground to absorb high frequency noise that couples from the main supply line 1228 to the regulated output node 1207 through the parasitic drain junction capacitance of the current source 1226. A compensation capacitor 1211 couples the output 1235 to ground to provide adequate phase-margin around the feedback loop of the self-bias shunt regulator 1200.

Figure 13:
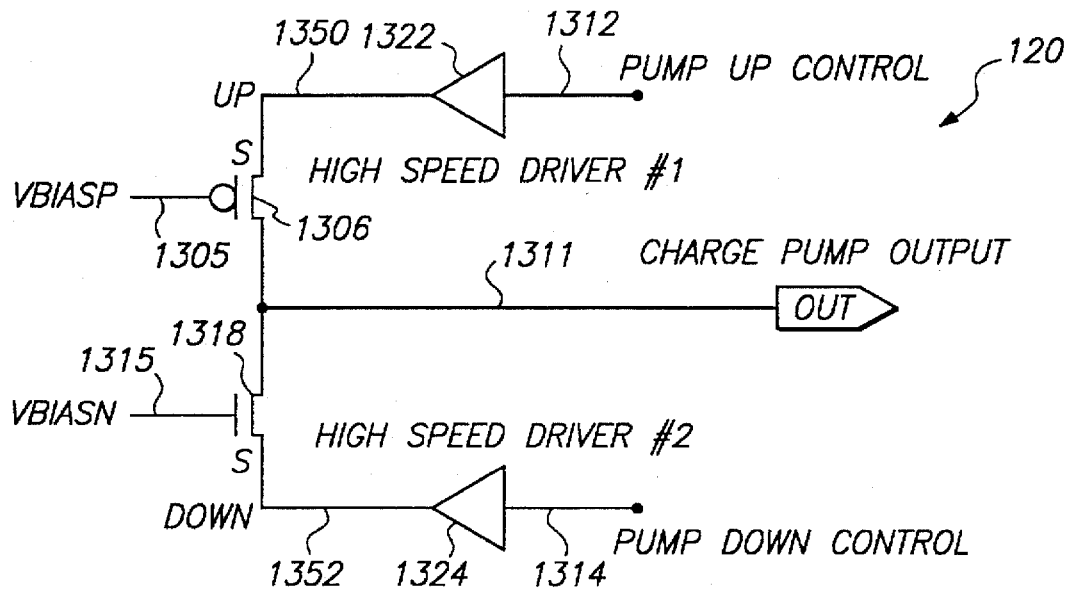
FIG. 13 is a schematic diagram illustrating a charge pump circuit in accordance with the present invention.

Referring to FIG. 13, there is shown a schematic diagram illustrating a charge pump circuit 120 in accordance with the present invention. A PFET 1306 has a gate coupled to a first low impedance bias voltage line 1305, has a drain coupled to an output 1311 of the charge pump, and has a source coupled to an output 1350 of a first high speed switching voltage driver 1322. The output 1350 of the high speed switching driver 1322 rapidly slews up to a positive power supply level in response to a change in a control signal applied to an input node 1312. When this happens, the transistor 1306 becomes a current source and provides a determinable current to the output node 1311. In response to an opposite input change at the node 1312, the output 1350 of the driver 1322 rapidly slews to a voltage level lower than the voltage on the bias line 1305. When this happens, the transistor 1306 stops conducting current to the output node 1311.

The charge pump also comprises an NFET 1318 having a gate coupled to a second low impedance bias voltage line 1315, having a drain coupled to output 1311 of the charge pump, and having a source coupled to an output 1352 of a second high speed switching voltage driver 1324. The output 1352 of the high speed switching driver 1324 rapidly slews down to a negative power supply level in response to a change in a control signal applied to an input node 1314. Responsive to such a voltage, the transistor 1318 becomes a current source and provides a determinable current to the output node 1311. In response to an opposite input change at the input node 1314, the driver 1324 rapidly slews to a voltage level higher than the voltage on the bias line 1315. Responsive to reaching such a voltage, the transistor 1318 stops conducting current to the output node 1311.

Rapid voltage changes on the nodes 1350 and 1352 cause unwanted charge injection into the lines 1305 and 1315, respectively, through the source/gate capacitance of respective transistors 1306 and 1318. However, there is little or no direct charge injection from the source to the drain of the transistors 1306 and 1318. Because the lines 1305 and 1315 are low impedance, the bias voltages on the lines 1305 and 1315 are not disturbed appreciably by the source-gate charge injection. The low disturbance on the bias lines 1305 and 1315 allows the charge pump 120 to operate at low current levels accurately at very high switching speeds.

Figure 14:
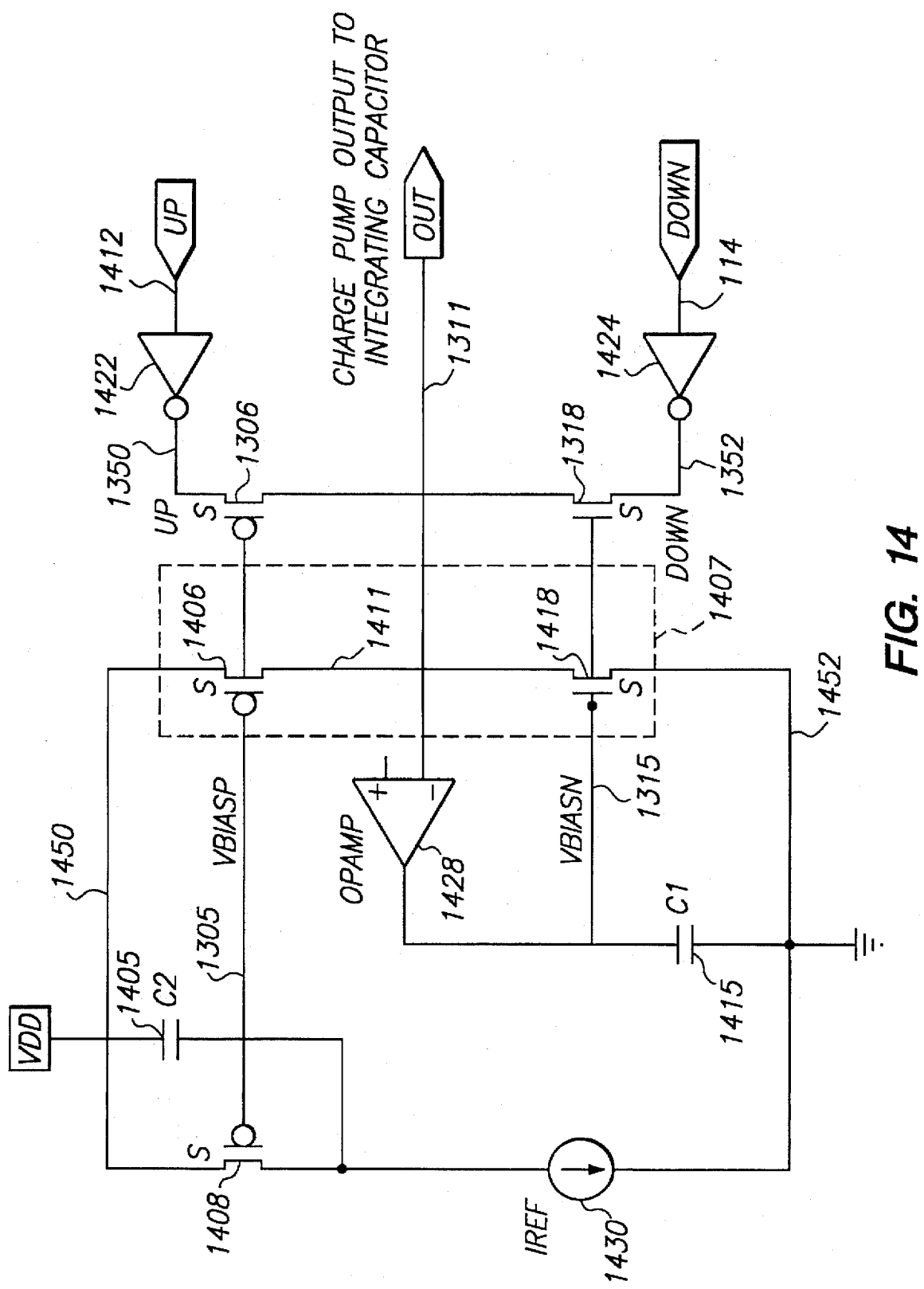
FIG. 14 is a schematic diagram illustrating a preferred embodiment of the charge pump circuit of FIG. 13.

Referring to FIG. 14, there is shown a schematic diagram illustrating a preferred embodiment of the charge pump circuit of FIG. 13. The high speed driver 1322 and 1324 of FIG. 13 are implemented with CMOS inverters 1422 and 1424, respectively. A "pump down" control input signal 114 applied to the inverter 1424 may be the same signal as the "down" signal 114 of FIG. 1. A "not pump up" control input signal 1412 applied to the inverter 1422 may be an inverted version of the "up" signal 112 of FIG. 1. The bias voltage line 1305 receives a bias voltage from a combination of a current source reference 1430 and a diode connected PFET 1408 having a gate coupled to a drain. If the transistor 1306 is "on" in response to a pump up signal, the transistor pair 1408 and 1306 form a current mirror. Thus, the pump-up current is a predetermined ratio of the current reference Iref, dictated by the size ratio of the transistors 1408 and 1306.

The second bias voltage line 1315 for the pump-down transistor 1318 is derived differently. Because of relatively low output impedance of CMOS transistors, the actual current flowing through the output of a current mirror is not a constant ratio of the reference current the current mirror receives. The current output of a current mirror varies to a certain extent as a function of the voltage applied at the output of the current mirror. If the second bias line 1315 is derived in a similar way the first bias line 1305 is generated, the current flowing through transistors 1318 and 1306 will not match over a wide range of output voltage at the node 1311. To obtain matching currents through the transistors 1306 and 1318, the charge pump includes a replica charge pump 1407 having replica transistors 1406 and 1418. The ratio of the size of the transistor 1406 to the size of the transistor 1306 equals the ratio of the size of transistor 1418 to the size of transistor 1318. The replica transistors 1406 and 1418 are always "on". That is, the source terminal of the transistor 1406 is coupled to a positive supply line 1450 and the source terminal of the transistor 1418 is coupled to a negative supply line 1452. An operational amplifier 1428 has a positive input coupled to a node 1411, which is the common drain node of the replica transistors 1406 and 1418. A negative input of the operational amplifier 1428 is coupled to the charge pump output node 1311. The output of the operational amplifier 1428 provides the bias voltage on the second voltage bias line 1315. The operational amplifier 1428 forces the voltage on the node 1411 to stabilize to the voltage on the charge pump output 1311. When there is no change in voltage on node 1411, the drain currents of the transistors 1406 and 1418 are identical. Consequently, the turn-on drain current of the transistor 1306 matches the turn-on drain current of the transistor 1318, providing balanced charge pump operation.

For the charge pump to operate accurately at high switching speed, the bias nodes 1305 and 1315 must be of sufficiently low impedance to effectively absorb the unwanted charge injection from the nodes 1350 and 1352, respectively. This can be accomplished by ratio sizing all bias generating and/or replica charge pump transistors (e.g., transistors 1408, 1406, 1418) larger relative to the size of transistors 1306 and 1318. Decoupling capacitors 1405 and 1415 across the bias lines 1305 and 1315 and the respective reference power supply lines 1450 and 1452 also absorb the charge injection from the nodes 1350 and 1352, respectively. The capacitance value for the capacitors 1405 and 1415 is preferably many times larger than the source-gate capacitance of the transistor 1306 and the transistor 1318 to effectively attenuate ripples of the signals on the bias lines 1305 and 1315.

Figure 15:
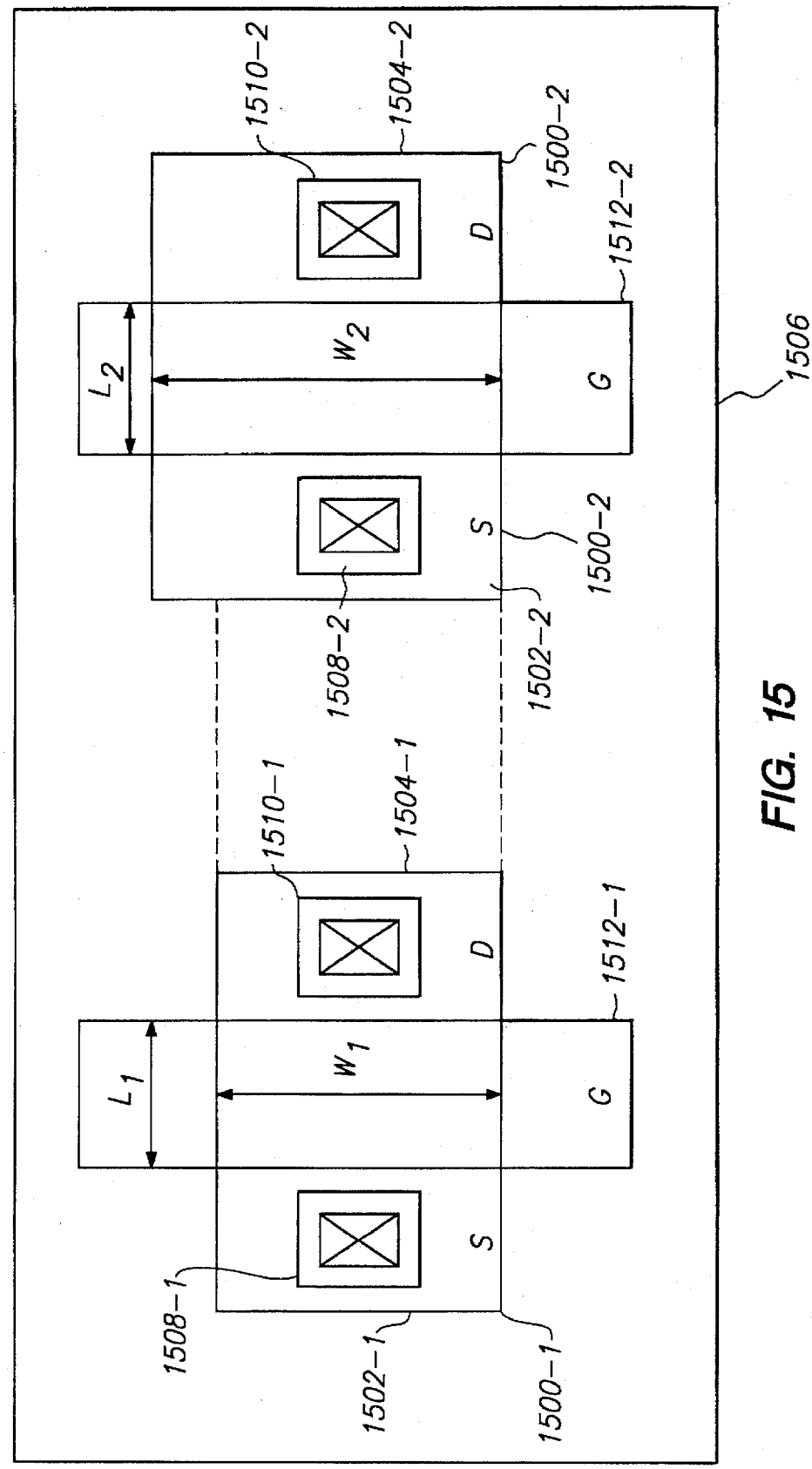
FIG. 15 is a pictorial top view of an integrated circuit implementation of transistors in the differential transconductors of FIGS. 16–17.

Referring to FIG. 15, there is shown a pictorial top view of an integrated circuit implementation of the transistors 722, 724, 726, and 728. Transistors 1500-1 and 1500-2 each have both a corresponding source 1502-1 and 1502-2 and a corresponding drain 1504-1 and 1504-2 in a silicon substrate 1506. Terminals 1508-1 and 1508-2 on the respective source 1502-1 and 1502-2 and terminals 1510-1 and 1510-2 on the respective drain 1504-1 and 1504-2 provide a conductive contact area for interconnections to other devices in the silicon substrate 1506. Gates 1512-1 and 1512-2 each comprising polysilicon are deposited on the substrate 1506 between the source 1502-1 and the drain 1504-1 and between the source 1502-2 and the drain 1504-2, respectively. The gate 1512-1 has a length $L_1$ and a width $W_1$. The gate 1512-2 has a length $L_2$ and a width $W_2$. The transconductance of the transistor 1500 is dependent on the ratio of the width W to the length L.

The transistor 1500-1 may be the loads of FIGS. 8.a through 8d and the transistor 1500-2 may be the transistors 808 through 826 of FIGS. 8e through 8h. The ratio $W_2:L_2$ is preferably greater than the ratio $W_1:L_1$ to achieve a negative output conductance for the differential transconductors.

Although a transistor may be described herein as a single transistor, multiple transistors with appropriate dimensional scaling may be used in lieu of the single transistor.

In other embodiments of phase lock loop and VCOs, the VCO may be built with three or more differential transconductors for a lower oscillation frequency. In such a VCO, the output impedance of the transconductors need not be negative. In addition, the voltage regulators 1000 and the shunt regulator 1200, described earlier herein, may be used to improve the extrinsic jitter of such a VCO.

For other embodiments using charge pumps, the charge pump 1400 may be used in circuits having capacitive integrators, such as servo-loops and gain control loops. A single directional version of the charge pump with only one current switch either from the positive or the negative power supply side may also be useful in some situation.

In summary, the phase lock loop comprising LFSR counters, the two stage regulated VCOs and the charge pump provides an oscillation signal that has low jitter, a low static phase error, and a quadrature output.

We claim:

1. A regulated supply voltage controlled oscillator comprising:

an unregulated voltage controlled oscillator having a regulated supply node for receiving a current draw;

a current source having an output coupled to the regulated supply node for providing a feed-forward current-draw indicative of a predicted current-draw of the unregulated voltage controlled oscillator; and a low-output impedance voltage buffer coupled to the regulated supply node for providing an error current responsive to the difference between the predicted current-draw and the current-draw of the unregulated voltage controlled oscillator.

2. The regulated supply voltage controlled oscillator of claim 1 wherein the unregulated voltage controlled oscillator is a voltage controlled oscillator comprising:

first and second differential transconductors;

the first differential transconductor having a positive input, a negative input, a positive output, a negative output, and a voltage control inputs; and the second differential transconductor having a positive input coupled to the positive output of the first differential transconductor, having a negative input coupled to the negative output of the first differential transconductor, having a positive output coupled to the negative input of the first differential transconductor, having a negative output coupled to the positive input of the first differential transconductor, and having a voltage control input coupled to the voltage control input of the first differential transconductor;

each differential transconductor having a negative output conductance.

3. The regulated supply voltage controlled oscillator of claim 2 wherein the first differential transconductor comprises:

a voltage-current converter having a first transistor of a first type having a drain coupled to a common source node;

a second transistor of the first type having a drain coupled to the negative output of the first differential transconductor, having a source coupled to the common source node, and having a gate coupled to the positive input of the first differential transconductor; and a third transistor of the first type, having a drain coupled to the positive output of the first differential transconductor, having a source coupled to the source of the second transistor of the first type, and having a gate coupled to the negative input of the first differential transconductor.

4. The regulated supply voltage controlled oscillator of claim 1 wherein the current source comprises:

a current mirror having an output connected to the regulated supply node of the unregulated voltage controlled oscillator, and comprising transistors; and;

a first transistor of a first type having a gate coupled to the voltage control input of the unregulated voltage controlled oscillator, having a source coupled to a first power supply line, and having a drain coupled to the reference input of the current mirror;

the first transistor of the first type and the transistors of the current mirror being sized to have the current mirror produce an output current substantially equal to the current-draw of the unregulated voltage controlled oscillator.

5. The regulated supply voltage controlled oscillator of claim 1 wherein the low output impedance voltage buffer comprises:

an operational amplifier having a positive input connected to a reference voltage signal, having a negative input, and having an output coupled to the negative input of the operational amplifier to form the output of the voltage buffer.

6. The regulated supply voltage controlled oscillator of claim 1 wherein the low-output impedance voltage buffer comprises a self-bias shunt regulator having an operational amplifier having a power supply input coupled to the regulated supply node and having an output coupled to the power supply input for generating a regulated output voltage.

* * * * *